United States Patent
Lin

(10) Patent No.: US 6,448,644 B1
(45) Date of Patent: Sep. 10, 2002

(54) FLIP CHIP ASSEMBLY WITH VIA INTERCONNECTION

(76) Inventor: Charles W. C. Lin, 55 Cairnhill Road, #21-04 Cairnhill Plaza, Singapore 229666 (SG)

( * ) Notice: Subject to any disclaimer, the term of this patent is extended or adjusted under 35 U.S.C. 154(b) by 0 days.

(21) Appl. No.: 09/120,408

(22) Filed: Jul. 22, 1998

(30) Foreign Application Priority Data

May 2, 1998 (SG) .......................... 9800994-7

(51) Int. Cl.⁷ .................. H01L 23/48; H01L 23/52; H01L 29/40
(52) U.S. Cl. .............. 257/734; 257/778; 438/678; 427/123; 427/124; 427/97; 205/123
(58) Field of Search ............... 257/762, 738, 257/737, 766, 778, 734; 438/678, 123; 205/126, 125, 128, 118; 427/123, 97, 124

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,327,010 A | 7/1994 | Uenaka et al. | 257/679 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

*Primary Examiner*—Mary Wilczewski
(74) *Attorney, Agent, or Firm*—David M. Sigmond

(57) ABSTRACT

A flip chip assembly, and methods of forming the same, including a single layer or multilayer substrate in which via holes serve as connections between a semiconductor chip and the substrate. The assembling steps comprise attaching an integrated circuit chip to a rigid or flexible dielectric substrate having a plurality of via holes for connecting respective traces on the substrate with respective input/output terminal pads of the integrated circuit chip. The via holes are aligned and placed on top of the pads so that the pads are totally or partially exposed through the opposite side of the substrate. Electrically conductive material is subsequently deposited in the via holes as well as on the surface of the pads to provide electrical connections between the integrated circuit chip and the traces of the dielectric circuitry. After the connections are made, the attachment between the chip and substrate can be removed or left as an integral part of the assembly since the connections also provide mechanical support. The contacting materials include electroless plated metals, electrochemical plated metals, solders, epoxies and conductive polymers.

78 Claims, 5 Drawing Sheets

U.S. PATENT DOCUMENTS

| | | | | |
|---|---|---|---|---|
| 5,334,804 A | | 8/1994 | Love et al. | 174/267 |
| 5,346,750 A | | 9/1994 | Hatakeyama et al. | 428/209 |
| 5,355,283 A | | 10/1994 | Marrs et al. | 361/760 |
| 5,358,621 A | | 10/1994 | Oyama | 205/123 |
| 5,397,921 A | | 3/1995 | Karnezos | 257/779 |
| 5,407,864 A | | 4/1995 | Kim | 437/203 |
| 5,424,245 A | | 6/1995 | Gurtler et al. | 437/183 |
| 5,438,477 A | | 8/1995 | Pasch | 361/689 |
| 5,439,162 A | | 8/1995 | George et al. | 228/180.22 |
| 5,447,886 A | | 9/1995 | Rai | 437/183 |
| 5,454,161 A | | 10/1995 | Beilin et al. | 29/852 |
| 5,454,928 A | | 10/1995 | Rogers et al. | 205/125 |
| 5,475,236 A | | 12/1995 | Yoshizaki | 257/48 |
| 5,477,933 A | | 12/1995 | Nguyen | 174/262 |
| 5,478,007 A | | 12/1995 | Marrs | 228/180.22 |
| 5,483,421 A | | 1/1996 | Gedney et al. | 361/771 |
| 5,484,647 A | | 1/1996 | Nakatani et al. | 428/209 |
| 5,487,218 A | | 1/1996 | Bhatt et al. | 29/852 |
| 5,489,804 A | | 2/1996 | Pasch | 257/778 |
| 5,493,096 A | | 2/1996 | Koh | 219/121.71 |
| 5,508,229 A | | 4/1996 | Baker | 437/183 |
| 5,525,065 A | | 6/1996 | Sobhani | 439/67 |
| 5,536,973 A | | 7/1996 | Yamaji | 257/737 |
| 5,542,601 A | | 8/1996 | Fallon et al. | 228/119 |
| 5,547,740 A | | 8/1996 | Higdon et al. | 428/209 |
| 5,556,810 A | | 9/1996 | Fujitsu | 437/209 |
| 5,556,814 A | | 9/1996 | Inoue et al. | 437/230 |
| 5,564,181 A | | 10/1996 | Dineen et al. | 29/841 |
| 5,572,069 A | | 11/1996 | Schneider | 257/690 |
| 5,576,052 A | | 11/1996 | Arledge et al. | 427/98 |
| 5,583,073 A | * | 12/1996 | Lin et al. | 439/183 |
| 5,595,943 A | | 1/1997 | Itabashi et al. | 437/230 |
| 5,599,744 A | | 2/1997 | Koh et al. | 437/195 |
| 5,611,140 A | | 3/1997 | Kulesza et al. | 29/832 |
| 5,611,884 A | | 3/1997 | Bearinger et al. | 156/325 |
| 5,613,296 A | | 3/1997 | Kurino et al. | 29/852 |
| 5,614,114 A | | 3/1997 | Owen | 219/121.66 |
| 5,615,477 A | | 4/1997 | Sweitzer | 29/840 |
| 5,619,791 A | | 4/1997 | Lambrecht, Jr. et al. | 29/852 |
| 5,627,405 A | | 5/1997 | Chillara | 257/668 |
| 5,627,406 A | | 5/1997 | Pace | 257/700 |
| 5,633,204 A | | 5/1997 | Tago et al. | 438/614 |
| 5,637,920 A | | 6/1997 | Loo | 257/700 |
| 5,641,113 A | | 6/1997 | Somaki et al. | 228/180.22 |
| 5,645,628 A | | 7/1997 | Endo et al. | 106/1.23 |
| 5,646,067 A | | 7/1997 | Gaul | 437/180 |
| 5,648,686 A | | 7/1997 | Hirano et al. | 257/778 |
| 5,654,584 A | | 8/1997 | Fujitsu | 257/666 |
| 5,656,858 A | | 8/1997 | Kondo et al. | 257/737 |
| 5,663,598 A | | 9/1997 | Lake et al. | 257/737 |
| 5,665,652 A | | 9/1997 | Shimizu | 438/127 |
| 5,666,008 A | | 9/1997 | Tomita et al. | 257/778 |
| 5,669,545 A | | 9/1997 | Pham et al. | 228/1.1 |
| 5,674,785 A | | 10/1997 | Akram et al. | 437/217 |
| 5,674,787 A | | 10/1997 | Zhao et al. | 437/230 |
| 5,682,061 A | | 10/1997 | Khandros et al. | 257/666 |
| 5,691,041 A | | 11/1997 | Frankeny et al. | 428/209 |
| 5,722,162 A | | 3/1998 | Chou et al. | 29/852 |
| 5,723,369 A | | 3/1998 | Barber | 438/106 |
| 5,731,223 A | | 3/1998 | Padmanabhan | 437/183 |
| 5,736,456 A | | 4/1998 | Akram | 438/614 |
| 5,739,585 A | | 4/1998 | Akram et al. | 257/698 |
| 5,744,859 A | | 4/1998 | Ouchida | 257/668 |
| 5,757,071 A | | 5/1998 | Bhansali | 257/697 |
| 5,757,081 A | | 5/1998 | Chang et al. | 257/778 |
| 5,764,486 A | | 6/1998 | Pendse | 361/774 |
| 5,774,340 A | | 6/1998 | Chang et al. | 361/771 |
| 5,789,271 A | | 8/1998 | Akram | 438/18 |
| 5,798,285 A | | 8/1998 | Bentlage et al. | 438/108 |
| 5,801,072 A | | 9/1998 | Barber | 438/107 |
| 5,801,447 A | | 9/1998 | Hirano et al. | 257/778 |
| 5,803,340 A | | 9/1998 | Yeh et al. | 228/56.3 |
| 5,804,771 A | | 9/1998 | McMahon et al. | 174/255 |
| 5,808,360 A | | 9/1998 | Akram | 257/738 |
| 5,811,879 A | | 9/1998 | Akram | 257/723 |
| 5,817,541 A | | 10/1998 | Averkiou et al. | 438/107 |
| 5,822,856 A | * | 10/1998 | Bhatt et al. | 29/832 |
| 5,834,844 A | | 11/1998 | Akagawa et al. | 257/734 |
| 5,861,666 A | | 1/1999 | Bellaar | 257/686 |
| 5,863,816 A | | 1/1999 | Cho | 438/123 |
| 5,870,289 A | * | 2/1999 | Tokuda et al. | 361/779 |
| 5,883,435 A | | 3/1999 | Geffken et al. | 257/758 |
| 5,925,931 A | | 7/1999 | Yamamoto | 257/737 |
| 5,994,222 A | | 11/1999 | Smith et al. | 438/689 |
| 6,012,224 A | | 1/2000 | DiStefano et al. | 29/840 |
| 6,013,877 A | | 1/2000 | Degani et al. | 174/264 |
| 6,018,196 A | * | 1/2000 | Noddin | 257/777 |
| 6,020,561 A | | 2/2000 | Ishida et al. | 174/261 |
| 6,037,665 A | | 3/2000 | Miyazaki | 257/773 |
| 6,044,550 A | * | 4/2000 | Larson | 29/582 |
| 6,046,909 A | | 4/2000 | Joy | 361/748 |
| 6,084,297 A | * | 7/2000 | Brooks et al. | 257/698 |
| 6,084,781 A | | 7/2000 | Klein | 361/771 |
| 6,103,552 A | * | 8/2000 | Lin | 438/113 |
| 6,103,992 A | * | 8/2000 | Noddin | 219/121.71 |
| 6,127,204 A | | 10/2000 | Isaacs et al. | 438/106 |

* cited by examiner

FLIP CHIP ASSEMBLY WITH VIA INTERCONNECTION

BACKGROUND OF THE INVENTION

1. Field of the Invention

This invention relates generally to integrated circuit assemblies, and in particular, to the electrical connection of integrated circuits to substrate circuitry, printed circuit board, and interconnect components. Most specifically, the invention relates to a flip chip assembly which includes a single or multi-layered substrate in which via holes are electrically and mechanically connected to the input/output terminal pads of the integrated circuits through direct metallization.

2. Related Art

Recent developments of semiconductor packaging suggest an increasingly critical role of the technology. New demands are coming from requirements for more leads per chip and hence smaller input/output terminal pad pitch, shrinking die and package footprints, and higher operational frequencies that generate more heat, thus requiring advanced heat dissipation designs. In addition to these demands, the more stringent electrical requirements must not be compromised by the packaging. All of these considerations must be met and, as usual, placed in addition to the cost that packaging adds to the semiconductor-manufacturing food chain.

Conventionally, there are three predominant chip-level connection technologies in use for integrated circuits, namely wire bonding, tape automated bonding (TAB) and flip chip (FC) to electrically or mechanically connect integrated circuits to leadframe or substrate circuitry. Wire bonding has been by far the most broadly applied technique in the semiconductor industry because of its maturity and cost effectiveness. However, this process can be performed only one wire bond at a time between semiconductor chip's bonding pads and the appropriate interconnect points. Furthermore, because of the ever increasing operational frequency of the device, the length of the interconnects needs to be shorter to minimize inductive noise in power and ground, and also to minimize cross-talk between the signal leads. An example of such a method is disclosed in U.S. Pat. No. 5,397,921 to Karnezos.

Flip chip technology involves mounting of an unpackaged semiconductor chip with the active side facing down to an interconnect substrate through contact anchors such as solder, gold or organic conductive adhesive bumps. The major advantage of flip chip technology is the short interconnects which, therefore, can handle high speed or high frequency signals. There are essentially no parasitic elements such as inductance. Not only is the signal propagation delay slashed, but much of the waveform distortion is also eliminated. Flip chip also allows an area array interconnecting layout that provides more I/O than a perimeter interconnect with the same die size. Furthermore, it requires minimal mounting area and weight which results in overall cost saving since no extra packaging and less circuit board space is used. An example of such a method is disclosed in U.S. Pat. No. 5,261,593 to Casson et al.

FIG. 1 is a schematic cross-sectional view of a prior art flip chip assembly in which an integrated circuit chip 101 is attached to a substrate 102 through electrically conductive bumps 103. These bumps 103 make electrical connection between bond pads 104 formed on the chip 101 and specific one of the conductive traces 105 formed on the surface of the substrate 102. These traces 105 further extend to the other side of the substrate 103 through via holes 107 that are formed within the substrate 102. In the dielectric substrate, a via hole connects two or multiple layers of circuitry in a substrate. It can link both sides of the finished substrate, whereas a blind via link one side to one or multiple internal layers and a buried via links internal layers without being visible on the surface of the board. These via holes are typically metallized on the sidewall with copper by electroless plating and electroplating. Underfilled material 106 is typically applied between integrated circuit chip 101 and substrate 102 in order to reduce the stress due to thermal characteristic mismatch of the chip 101 and substrate 102. Conductive traces 105 formed on the top of the substrate 102 extend from the via holes to specific contacting pads or balls 108 and therefore connect to the external circuitry.

While flip chip technology has tremendous advantages over wire bonding, its cost and technical limitations are significant. First of all, flip chip technology must confront the challenge of forming protruded contact anchors or bumps to serve as electrical connections between the integrated circuit chip and substrate circuitry. A variety of bumping processes have therefore been developed. These include a vacuum deposition of an intermediate under-bump layer which serves as an adhesive and diffusion barrier. This barrier layer is composed of a film stack which can be in the structure of chromium/copper/gold. Bumping materials such as solder are subsequently deposited onto this intermediate layer through evaporation, sputtering, electroplating, solder jetting or paste printing methods followed by a reflow step to form the solder contacts.

Techniques for fabricating the intermediate under-bump barrier layer as well as the bump material utilizing electroless plating are also known. In these attempts, as shown in FIG. 2, the input/output terminal pads 201 of the integrated circuit chip 200 are firstly activated/by a catalytic solution which will selectively activate the pad material through chemical reactions and form a thin layer of catalyst 202. This thin layer of catalyst 202 is typically composed of zinc or palladium. When electroless plating is executed thereafter, material such as nickel, gold, palladium or their alloys can be selectively initiated and continuously deposited on the pads to form the bumps 203. In the above-described electroless plating process, hypophosphate or boron hydride are commonly used as the reducing agent in the nickel plating solution. This electroless plated bump not only provides the protruding contact anchor but also serves as the diffusion barrier and sealing. Contacting material such as solder, conductive adhesive or polymer is subsequently applied onto these bumps by techniques such as solder dipping, solder jetting, evaporation, screen printing or dispensing. An example of such a method is described in the U.S. Pat. No. 5,583,073, to Lin et al.

Although the electroless technique provides an economical, simple and effective method for fabricating the under bump barrier layer, contacting material such as solder or adhesive is still required for assembling. Solder dipping or screen printing of solder paste onto these bumps has been explored but with very limited success due to solder bridging and non-uniform deposition of solder on the metal bumps. This process also; it suffers from poor process control as the input/output terminal pad spacing gets smaller. Additional problems have been encountered with tin/lead solder due to its increase in electrical resistance over time. Moreover, the solder contacts are easily fatigued by mechanical stressing.

Organic contacts which utilize conductive adhesive to replace solder joint is also described by U.S. Pat. No.

5,627,405, to Chillara. Generally speaking, the conductive adhesive, which is made by adding conductive fillers to polymer binders, holds a number of technical advantages over soldering such as environmental compatibility, lower-temperature processing capability, fine pitch and simplified processes. However, conducive adhesive does not normally form the metallurgical interface in the classical sense. The basic electrical pathway is through conductive particles of the adhesive that are in contact with one another and reach out to the two contact surfaces of the components. Under certain environments, this interconnect system may cause problems because the penetration of moisture through the polymer may induce corrosion and oxidation of the conducting metal particles which results in unstable electrical contacts. Furthermore, failure of the joints can also occur due to degradation of the polymer matrix as well as degradation of the metal parts. Since the electrical and mechanical performance are independent of each other, good mechanical performance is no assurance of electrical integrity.

In view of the limitations in the currently available integrated circuit assembling methods, a high-performance, reliable and economical method which interconnects integrated circuits to the external circuitry would be greatly desirable.

SUMMARY OF THE INVENTION

According to the invention, a flip chip assembly is provided to address high density, low cost and high performance requirements of electronics products. It involves the direct interconnection of integrated circuit chip to substrate circuitry through direct metallization of via holes and bond pads without the need for bumps, wire bonds, or other media.

To achieve the foregoing and in accordance with the invention, the assembly includes a rigid or flexible dielectric substrate having a plurality of electrically conductive circuitry, traces one or more integrated circuit chips having a plurality of input/output terminal pads, and a plurality of via holes formed in the dielectric substrate for electrically connecting respective traces of the substrate with respective pads of the integrated circuit chip. The surface of the integrated circuit chip and the dielectric substrate may be arranged in substantially mutually parallel planes. The orientation of the contact is in such a manner that the via holes in the dielectric substrate are aligned with the top of the pads of the integrated circuit chip so that these pads can be totally or partially exposed through the opposite side of the substrate. After the alignment, the connecting step may include attaching the integrated circuit chip to the dielectric substrate through mechanical or chemical techniques to form an assembly. Electrically conductive material is subsequently deposited in the via holes as well as on the surface of the input/output terminal pads of the integrated circuit chip to provide electrical and mechanical connections between the terminal pads and the traces of the dielectric circuitry. After the via holes are connected to the terminal pads, the mechanical and chemical means that provided the chip and substrate attachment can be removed or left as an integral part of the assembly since the via hole connections also provide mechanical support.

In a method aspect of the invention, the connection is provided by electroless plating. The electroless plating initiates and continuously deposits electrically conductive material such as copper, nickel, palladium, gold and their alloys on the via hole side walls as well as input/output terminal pads of the integrated chip. As the plating process continues, the metallic surface of the via holes sidewalls and terminal pads will extend out and contact each other and finally join together and become an integrated part. These simultaneously electrolessly plated joints provide effective electrical and mechanical connections between the integrated circuit chip and the dielectric circuitry.

In another method aspect of the invention, the connection may take the form of electrochemical plating. In this method, metallized via holes in the dielectric substrate are electrically connected to an external power source and serve as one electrode for plating. This plating process can be carried out on the sidewalls of via holes as well as other areas that receive electricity from the power source and are exposed to the electrochemical plating solution. In the initial stage, the terminal pads of the integrated circuit chip do not receive electroplating due to lack of electrical contact with the power source. However, as the via hole sidewall plating process continues, the metallizing surface will extend out and finally contact and provide electricity to the terminal pads and subsequently initiate electroplating on them. These simultaneously electroplated parts join together and provide effective electrical and mechanical connections between the chip and the dielectric circuitry.

According to a further aspect of the invention, the connection may take the form of solder paste, liquid solder, solder particles, epoxy or conductive polymer which is reflowable and bondable to the integrated circuit chip terminal pads and via hole walls after the application of an energy source such as a laser or infrared light. In this method, the filling material can be filled into the via holes through selective printing, jetting or ball placement techniques. As the external energy such as heat or a laser applied to the filling material, the original form of the material will melt and change its shape, enlarge the contacting areas, and adhere to the wettable surfaces thus providing an effective electrical and mechanical contacts between pre-metallized via hole sidewalls and input/output terminal pads of the integrated circuit chips. In some embodiments, these input/output terminal pads are pre-treated or coated with a thin protective layer if the material is vulnerable to corrosion or dissolution through reactions by the joint material such as solder.

According to the invention, via holes of the substrate can be formed by various techniques including mechanical drilling, punching, plasma etching or laser drilling. They are formed in the substrate at locations where electrical circuitry on one side of the substrate can be connected to the opposite side of the surface on which the semiconductor chip or chips are mounted and their input/output terminal pads can be exposed through these holes.

According to the invention, dielectric layers of the rigid substrate can be either organic or inorganic material. An organic type substrate is preferable for lower cost, and superior dielectric property whereas an inorganic substrate is preferable when high thermal dissipation and matched coefficient of expansion are desired. Suitable dielectrics include plastics, ceramics and flexible films.

If the finished product is, for instance, a ball grid array, solder balls can be formed on the traces. This finished package can be connected to a printed circuit board by reflowing the solder balls to form an attachment to the conductors on the surface of the printed circuit board.

In summary, using via hole direct connection of an integrated circuit chip and dielectric substrate circuitry instead of anchoring solder or a conductive adhesive bump allows a high reliability, low profile, and high performance assembly to be achieved. In particular, a small via hole formed by laser drilling or other techniques allows a very fine pitch terminal pad to be interconnected, which can significantly enhance the capability of packaging future high I/O semiconductor chips.

DETAILED DESCRIPTION OF THE INVENTION

The present invention will be illustrated further by the following examples. These examples are meant to illustrate and not to limit the invention, the scope of which is defined solely by the appended claims.

EXAMPLE 1

Figure 1:
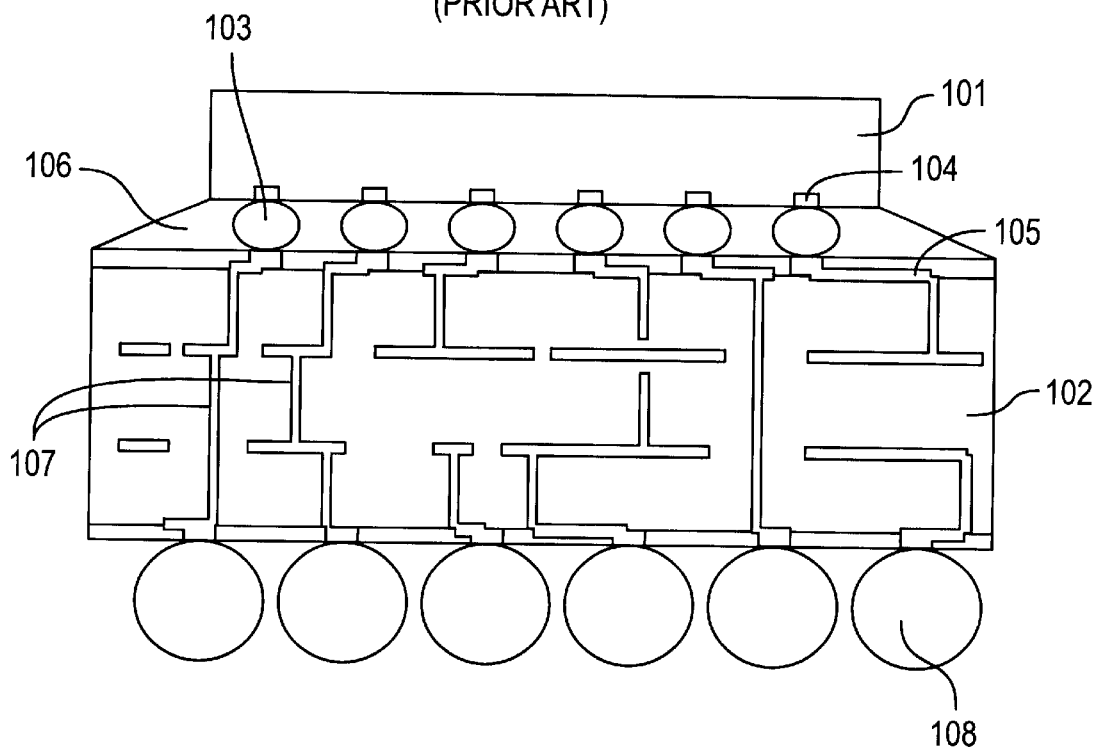
FIG. 1 (prior art) is a diagrammatic cross-sectional view of a conventional flip chip package with solder bumps.
Figure 2:
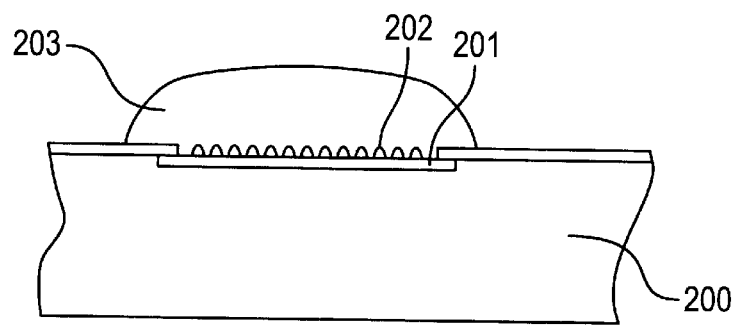
FIG. 2 (prior art) is a diagrammatic cross-sectional view of conventional electroless plated nickel bump structure.
Figure 3A:
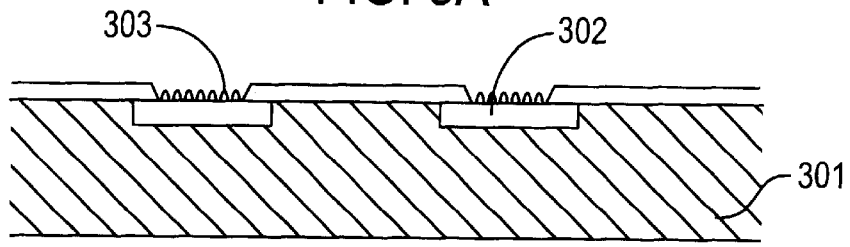
FIGS. 3A to 3D are diagrammatic cross-sectional views showing the steps involved in the manufacturing of an integrated circuit assembly by electroless plating according to an embodiment of the invention.

FIGS. 3A through 3D illustrate a process for producing an embodiment of the flip chip assembly according to the present invention. Referring initially to FIG. 3A, an integrated circuit chip 301 in which various types of transistors, wiring and the like are formed (not shown) has a plurality of exposed input/output terminal pads 302 exposed. These pads 302 are firstly cleaned by dipping the integrated circuit chip 301 in a phosphoric acid solution at room temperature with an immersion time of 10 minutes to remove the surface oxide film. This chip is next dipped in a diluted catalytic solution Enthone "Alumon EN" (trademark) at 25 degrees C. for 20 seconds to form a thin zinc film 303 on the surface of the aluminum alloy terminals 302, followed by a thorough distillated water rinse to ensure there is no residue left on the surface of integrated circuit chip 301.

Figure 3B:
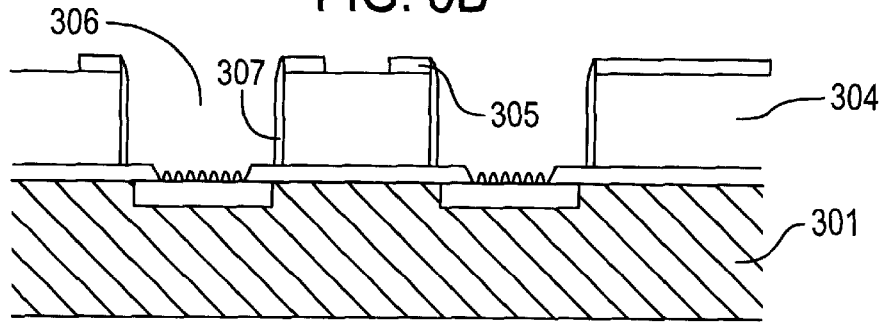

FIG. 3B shows a double-sided or multi-layer dielectric substrate 304 having a plurality of electrically conductive circuitry traces 305 attached to the integrated circuit chip. The traces 305 on one surface of the substrate 304 extend to a plurality of via holes 306 of the dielectric substrate 304. The metallic film 307 on the sidewall of the via holes are formed by conventional techniques including electroless plating, sputtering or evaporation or a combination of these techniques. These holes 306 are arranged in such a manner that the terminal pads 302 of the integrated circuit chip 301 can be totally or partially exposed when integrated circuit chip 301 is mounted on the substrate 304. These holes 306 serve as electrically connecting channels for respective traces 305 on the top surface of the substrate 304 with respective terminal pads 302 of the integrated circuit chip 301. The metallic film on the sidewalls of via holes 306 is activated by immersing in a palladium chloride solution (0.05 M) for readily initiating electroless plating.

Figure 3C:
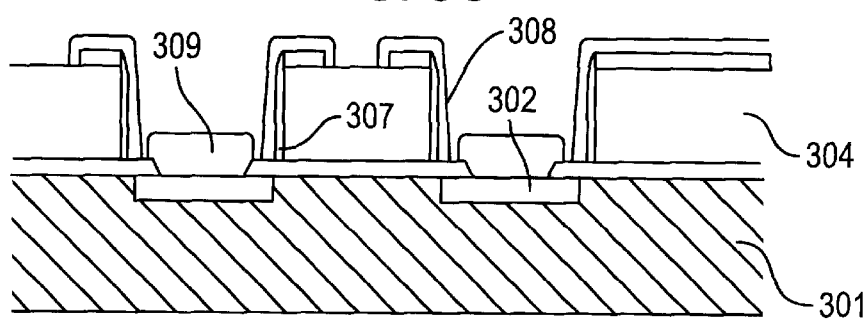

Now referring to FIG. 3C, after chip 301 is securely attached to the substrate 304, the chip assembly is immersed in the electroless plating solution Shipley "NIPOSIT 468" (trademark) at 65 degrees C. The electroless plating initiates and continuously deposit a thin layer of nickel film 308 containing phosphorous (to be referred to as a nickel film hereafter) on the pre-activated metal film 307 and nickel film 309 on the input/output terminal pads 302 of the integrated circuits chips 301.

Figure 3D:
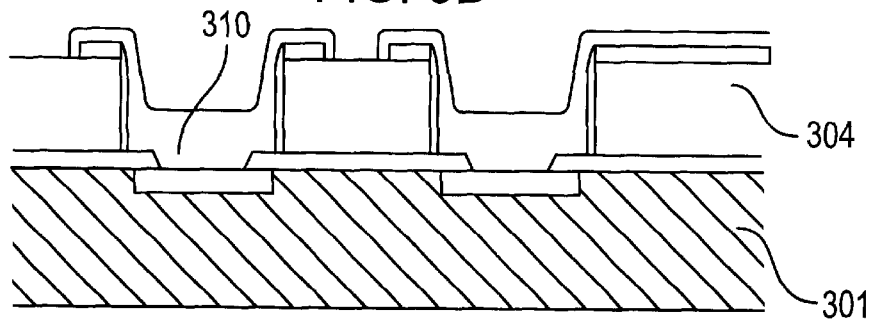

FIG. 3D shows the metallic surface of the via hole sidewalls and input/output terminal pads finally contact and join together become an integrated part 310 as the plating process continues. These simultaneously plated joints will then provide an effective electrical and mechanical connections between the input/output terminal pads and the traces of the dielectric circuitry.

Though only one integrated circuit chip 301 is shown, it is to be understood that additional integrated circuit chips, as well as passive components such as resistors or capacitors, can also be mounted on substrate 304.

EXAMPLE 2

Figure 4A:
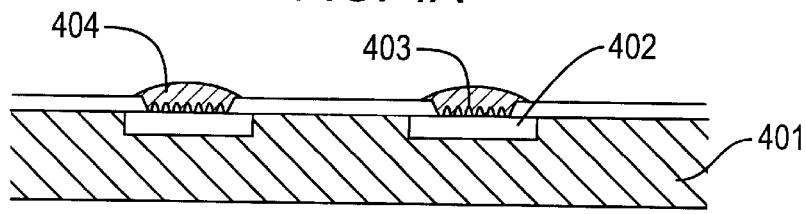
FIGS. 4A to 4E are diagrammatic cross-sectional views showing the steps involved in the manufacturing of an integrated circuit assembly by electroless via fill according to another embodiment of the invention.

FIGS. 4A through 4E illustrate a process for producing another embodiment of the flip chip assembly according to the present invention. Referring now to FIG. 4A, an integrated circuit chip 401 similar to that in example 1 is cleaned in an alkaline solution containing 0.02 M sodium hydroxide at room temperature (25 degrees C.) with immersion time of 1 minute. This chip 401 is next dipped in a catalytic solution Shipley "DURAPREP 40" (trademark) at 25 degrees C. with immersion time of 2 minutes to form an activation layer 403 on the surface of the terminal pads 402. After a thorough rinse in distilled water, the integrated circuit chip is immersed in a Shipley "NIPOSIT 468" (trademark) electroless plating bath for 2 minutes, at 65 degrees C. A thin layer of nickel film 404 containing phosphorous (to be referred to as a nickel film hereafter) precipitates on and around the terminal pads 402.

Figure 4B:
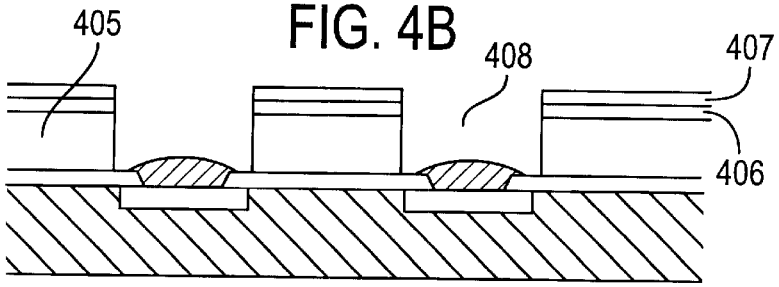

FIG. 4B shows a dielectric substrate 405 having a sheet of copper 406 on the top of the surface and covered by a layer of insulating film 407. A plurality of via holes 408 are drilled and arranged in such a manner that the input/output terminal pads 402 of the integrated circuit chip 401 can be totally or partially exposed when integrated circuit chip 401 is mounted on the substrate 405. There is no activation layer or metallized film on via hole sidewalls.

Figure 4C:
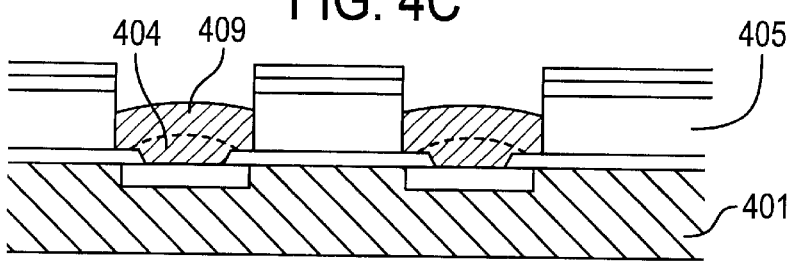

FIG. 4C shows the integrated circuit chip 401 securely attached to the substrate 405, the integrated circuit chip assembly is then immersed in the electroless plating solution Shipley "NIPOSIT 468" (trademark) at 65 degrees C. The electroless plating initiates and continuously deposits nickel pillar 409 on the top of the pre-deposited nickel film 404 (shown in phantom lines) of the integrated circuit chip 401.

Figure 4D:
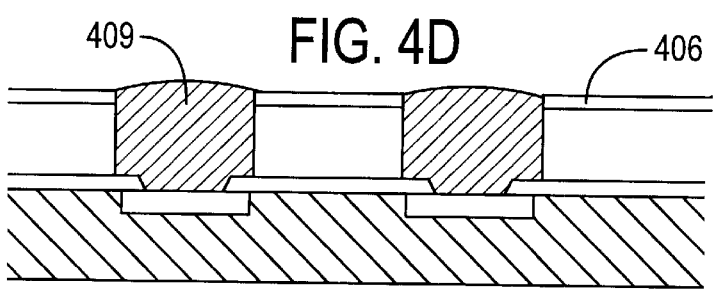

FIG. 4D shows that the plated nickel 409 has reached the dielectric edge of the hole 408 and contacts the top layer of copper sheet 406. The insulating film 407 is stripped off after the nickel via-fill reaches the copper sheet. These plated joints provide effective electrical and mechanical connections between the input/output terminal pads and the top surface of the dielectric circuitry.

Figure 4E:
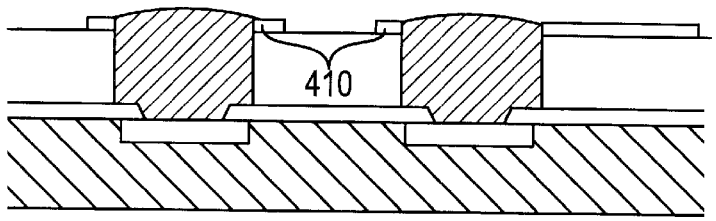

FIG. 4E shows a plurality of copper circuitry traces 410 formed on the surface of the substrate by conventional etching techniques. These traces 410 extend from a plurality of electroless nickel-filled holes 408 of the dielectric substrate 405 and serve as electrically connecting channels with respective input/output terminal pads 402 to the external circuitry.

EXAMPLE 3

Figure 5A:
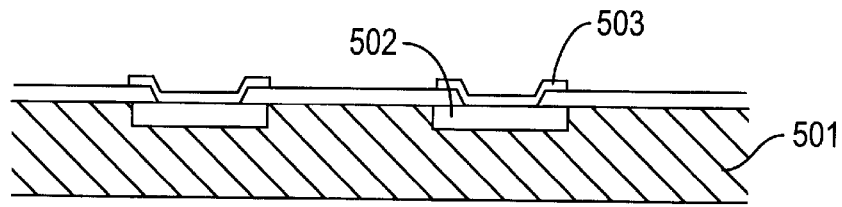
FIGS. 5A to 5E are diagrammatic cross-sectional views showing the steps involved in the manufacturing of an integrated circuit assembly by electroplating according to another embodiment of the invention.

FIGS. 5A through 5E illustrate a process for producing another embodiment of the flip chip assembly according to the present invention. Referring now to FIG. 5A, an integrated circuit chip 501 similar to that in example 1 is cleaned in an alkaline solution containing 0.05 M phosphoric acid at room temperature (25 degrees C.) with immersion time of 1 minute. The chip is then thoroughly rinsed in distilled water to ensure there is no residue left on the surface of integrated circuit chip. A multi-layered thin film 503 having the structure of chromium (500 A)/copper (700 A)/gold (1000 A), respectively, was selectively deposited on the terminal pads 502 to serve a barrier and adhesive layer.

Figure 5B:
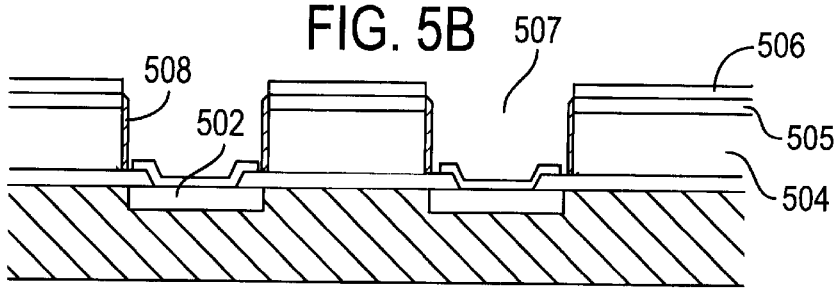

FIG. 5B shows a dielectric substrate 504 having a sheet of copper 505 on the top of the surface and covered by a layer of insulating film 506. A plurality of via holes 507 having a thin copper film 508 on the sidewalls is arranged in such a manner that the input/output terminal pads 502 of the integrated circuit chip 501 can be totally or partially exposed when it is mounted on the substrate 504.

Figure 5C:
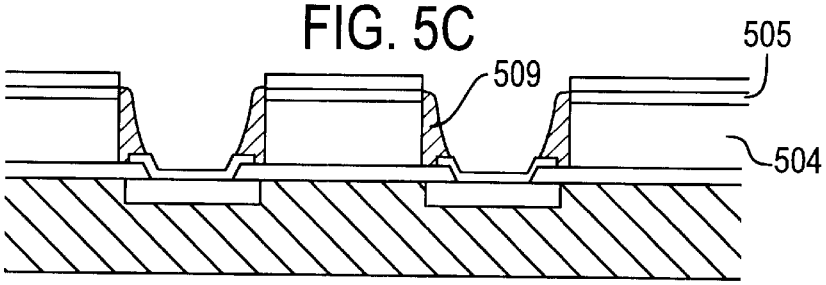

FIG. 5C show the assembly immersed in the copper plating solution Sel-Rex "CUBATH M" (trademark) at 25 degrees C. An electric power source is connected to the copper 505 on the top surface of the dielectric substrate. The electroplating reaction initiates and continuously deposits copper 509 on the sidewalls of the via holes. As the plating process proceeds, the sidewall copper 509 continually grows.

Figure 5D:
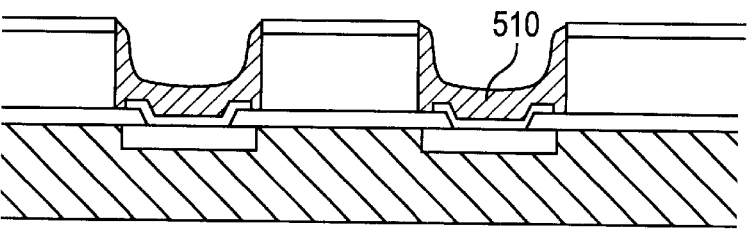

FIG. 5D shows the plated copper forming on the gold surface of the thin film 503 of the terminal pads to provide electrical contacts to the terminal pads and initiate plating copper thereon. These electroplated joints 510 provide effective electrical and mechanical connections between the input/output terminal pads and the top surface of the dielectric circuitry. The insulating layer 506 is stripped off.

Figure 5E:
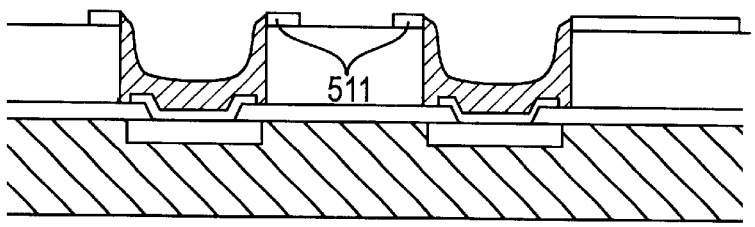

FIG. 5E shows a plurality of copper circuitry traces 511 formed on the surface of the substrate by conventional etching techniques. These traces 511 extend from a plurality of electroplated copper via holes 507 of the dielectric substrate 504 and serve as electrically connecting channels with respective input/output terminal pads 502 to the external circuitry.

EXAMPLE 4

Figure 6A:
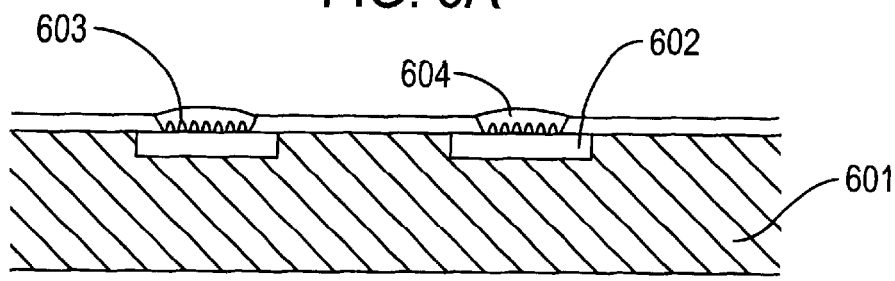
FIGS. 6A to 6D are diagrammatic cross-sectional views showing the steps involved in the manufacturing of an integrated circuit assembly by solder via fill according to another embodiment of the invention.

FIGS. 6A through 6D illustrate a process for producing another embodiment of the flip chip assembly according to the present invention. Referring now to FIG. 6A, an integrated circuit chip 601 similar to that in example 1 has a plurality of input/output terminal pads 602 exposed. These pads 602 are firstly cleaned by dipping the integrated circuit chip 601 in a phosphoric acid solution at room temperature with an immersion time of 10 minutes to remove the surface oxide film. This chip is next dipped in a diluted catalytic solution Enthone "Alumon EN" (trademark) at 25 degrees C. for 20 seconds to form an thin zinc film 603 on the surface of aluminum alloy terminal pads 602 followed by a thorough distillated water rinse to ensure there is no residue left on the surface of integrated circuitry chip. The integrated circuit chip is then immersed in a Shipley "NIPOSIT 468" (trademark) electroless plating bath for 2 minutes at 65 degrees C. A thin layer of nickel film 604 containing phosphorous is deposited on and around the terminal pads 602.

Figure 6B:
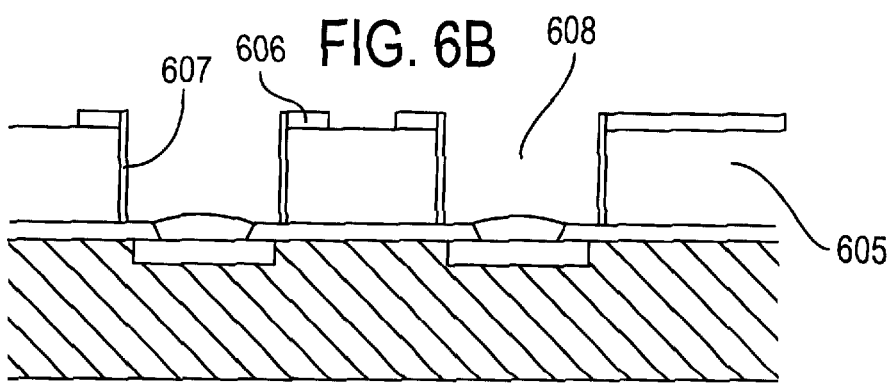

FIG. 6B shows a double-sided or multi-layer dielectric substrate 605 having a plurality of copper circuitry traces 606. The traces 606 on one surface of the substrate extend to a plurality of via holes 608 which are pre-metallized with gold plated copper film 607 on the sidewalls. These holes 608 are arranged in such a manner that the terminal pads 602 of the integrated circuit chip 601 can be totally or partially exposed when integrated circuit chip 601 is mounted on the substrate 605. These holes 608 serve as electrically connecting channels for respective traces 606 on the top surface of the substrate 605 with respective input/output terminal pads 602 of the integrated circuit chip 601.

Figure 6C:
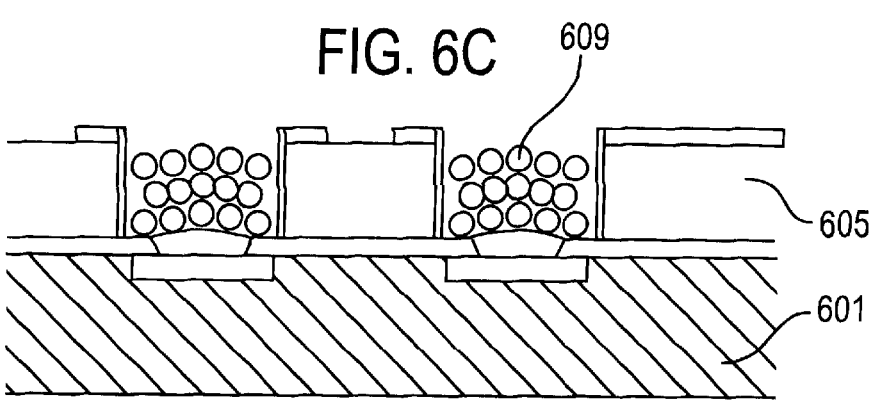

FIG. 6C shows the integrated circuit chip 601 securely attached to the substrate 605. Tin-lead solder balls 609 are placed into these via holes 608 by a conventional ball placement machine. Enough solder balls 609 should be placed to fill the via holes without exceeding the total volume.

Figure 6D:
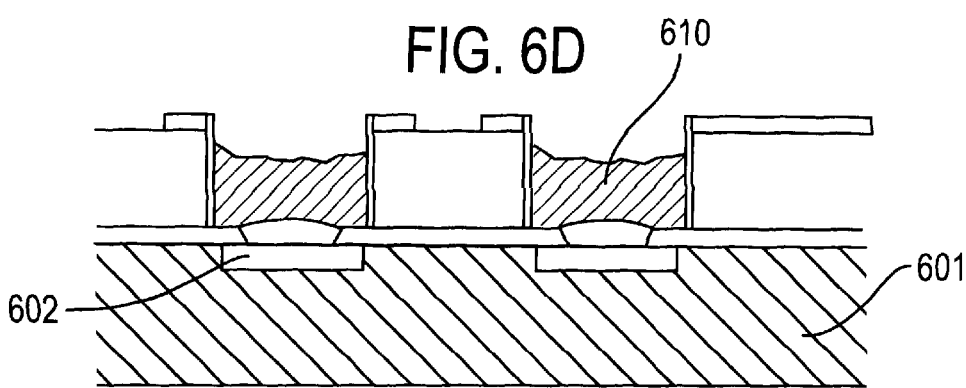

As shown in FIG. 6D, heat is applied to the assembly. When the temperature reaches 350 degrees C. for 1 minute, the solder balls melt and fill the lower part of the via holes. When the heat is removed, solder column 610 adheres to the sidewalls of the via holes as well as the input/output terminal pads 602 of the integrated circuit chip 601 thus providing effective electrical and mechanical contacts.

We claim:

1. An integrated circuit assembly, comprising:
   a dielectric substrate having first and second opposite surfaces and a plurality of via holes between the first and second surfaces;
   a metallic film deposited on and attached to sidewalls of the via holes that extends along the sidewalls to the first and second surfaces, wherein the metallic film initiates deposition of an electroless plating;
   a plurality of conductive traces on the first surface and adjacent to the via holes;
   an integrated circuit chip having a plurality of input/output terminal pads, wherein the integrated circuit chip is attached to the second surface of the dielectric substrate, the terminal pads are aligned with the via holes, and the terminal pads initiate deposition of the electroless plating; and
   the electroless plating simultaneously formed on the metallic film in the via holes, on the terminal pads and on the conductive traces, wherein each one of the terminal pads is connected to one of the conductive traces by one continuous portion if the electroless plating in one of the via holes.

2. The integrated circuit assembly according to claim 1, wherein the dielectric substrate is plastic.

3. The integrated circuit assembly according to claim 1, wherein the dielectric substrate is ceramic.

4. The integrated circuit assembly according to claim 1, wherein the dielectric substrate is a flexible film.

5. The integrated circuit assembly according to claim 1, wherein the via holes are formed by laser drilling.

6. The integrated circuit assembly according to claim 1, wherein the via holes are formed by mechanical punching.

7. The integrated circuit assembly according to claim 1, wherein the via holes are formed by plasma etching.

8. The integrated circuit assembly according to claim 1, wherein the metallic film comprises copper.

9. The integrated circuit assembly according to claim 1, wherein the metallic film comprises nickel.

10. The integrated circuit assembly according to claim 1, wherein the metallic film comprises palladium.

11. The integrated circuit assembly according to claim 1, wherein the metallic film comprises gold.

12. The integrated circuit assembly according to claim 1, wherein the assembly is devoid of wire bonds, TAB leads and solder joints .

13. The integrated circuit assembly according to claim 1, wherein the assembly is devoid of bumps on the terminal pads.

14. The integrated circuit assembly according to claim 1, wherein the integrated circuit chip is attached to the dielectric substrate solely by the electroless plating.

15. The integrated circuit assembly according to claim 1, wherein the integrated circuit chip is attached to the dielectric substrate by an adhesive film.

16. The integrated circuit assembly according to claim 1, wherein the integrated circuit chip is attached to the dielectric substrate by an adhesive film obtained from a liquid adhesive.

17. The integrated circuit assembly according to claim 1, wherein the integrated circuit chip is attached to the dielectric substrate by a mechanical clamp.

18. The integrated circuit assembly according to claim 1, wherein the electroless plating is nickel plating.

19. The integrated circuit assembly according to claim 1, wherein the electroless plating is gold plating.

20. The integrated circuit assembly according to claim 1, wherein the electroless plating is palladium plating.

21. The integrated circuit assembly according to claim 1, wherein the electroless plating is copper plating.

22. The integrated circuit assembly according to claim 1, wherein the metallic film includes a metal selected from the group consisting of electrolessly plated metal, sputtered metal and evaporated metal.

23. The integrated circuit assembly according to claim 1, wherein the metallic film includes electrolessly plated metal.

24. The integrated circuit assembly according to claim 1, wherein the metallic film includes sputtered metal.

25. The integrated circuit assembly according to claim 1, wherein the metallic film includes evaporated metal.

26. The integrated circuit assembly according to claim 1, wherein the metallic film includes a metal selected from the group consisting of copper, nickel and gold.

27. The integrated circuit assembly according to claim 1, wherein the metallic film is positioned outside the terminal pads and does not overlap the terminal pads.

28. The integrated circuit assembly according to claim 1, wherein the electroless plating is plated onto the metallic film, the terminal pads and the conductive traces.

29. The integrated circuit assembly according to claim 1, wherein the electroless plating includes a top surface that extends into the via holes.

30. The integrated circuit assembly according to claim 1, wherein the electroless plating has a bowl-like shape.

31. The integrated circuit assembly according to claim 1, wherein the conductive traces are positioned outside the terminal pads and do not overlap the terminal pads.

32. An integrated circuit assembly, comprising:
a dielectric substrate having first and second opposite surfaces and a plurality of via holes between the first and second surfaces;
a metallic film deposited on and attached to sidewalls of the via holes that extends along the sidewalls to the first and second surfaces;
a plurality of conductive traces on the first surface and adjacent to the via holes;
an integrated circuit chip having a plurality of input/output terminal pads, wherein the integrated circuit chip is attached to the second surface of the dielectric substrate, and the terminal pads are aligned with the via holes; and
electroplating formed on the metallic film in the via holes, on the terminal pads and on the conductive traces, wherein each one of the terminal pads is connected to one of the conductive traces by one continuous portion of the electroplating in one of the via holes.

33. The integrated circuit assembly according to claim 32, wherein the assembly is devoid of wire bonds, TAB leads and solder joints.

34. The integral circuit assembly according to claim 32, wherein the assembly is devoid of bumps on the terminal pads.

35. The integrated circuit assembly according to claim 32, wherein the integrated circuit chip is attached to the dielectric substrate solely by the electroplating.

36. The integrated circuit assembly according to claim 32, wherein the metallic film includes a metal selected from the group consisting of electrolessly plated metal, sputtered metal and evaporated metal.

37. The integrated circuit assembly according to claim 32, wherein the metallic film includes electrolessly plated metal.

38. The integrated circuit assembly according to claim 32, wherein the metallic film includes sputtered metal.

39. The integrated circuit assembly according to claim 32, wherein the metallic film includes evaporated metal.

40. The integrated circuit assembly according to claim 32, wherein the metallic film includes a metal selected from the group consisting of copper, nickel and gold.

41. The integrated circuit assembly according to claim 32, wherein the metallic film is positioned outside the terminal pads and does not overlap the terminal pads.

42. The integrated circuit assembly according to claim 32, wherein the electroplating is plated onto the metallic film, the terminal pads and the conductive traces.

43. The integrated circuit assembly according to claim 32, wherein the electroplating includes a top surface that extends into the via holes.

44. The integrated circuit assembly according to claim 32, wherein the electroplating has a bowl-like shape.

45. The integrated circuit assembly according to claim 32, wherein the conductive traces are positioned outside the terminal pads and do not overlap the terminal pads.

46. An integrated circuit assembly, comprising:
a dielectric substrate having first and second opposite surfaces and a plurality of via holes between the first and second surfaces;
a metallic film deposited on and attached to sidewalls of the via holes that extends along the sidewalls to the first and second surfaces;
a plurality of conductive traces on the first surface and adjacent to the via holes;
an integrated circuit chip having a plurality of input/output terminal pads, wherein the integrated circuit chip is attached to the second surface of the dielectric substrate, and the terminal pads are aligned with the via holes; and
a plated metal formed on the metallic film in the via holes, on the terminal pads and on the conductive traces, wherein each one of the terminal pads is connected to one of the conductive traces by one continuous portion of the plated metal in one of the via holes.

47. The integrated circuit assembly according to claim 46, wherein the terminal pads are spaced from the metallic film on the sidewalls of the via holes, and the plated metal is formed on an insulative surface substantially parallel to the second surface that extends between the terminal pads and the metallic film on the sidewalls.

48. The integrated circuit assembly according to claim 46, wherein the assembly is devoid of wire bonds, TAB leads and solder joints.

49. The integrated circuit assembly according to claim 46, wherein the assembly is devoid of bumps on the terminal pads.

50. The integrated circuit assembly according to claim 46, wherein the integrated circuit chip is attached to the dielectric substrate solely by the plated metal.

51. The integrated circuit assembly according to claim 46, wherein the metallic film includes a metal selected from the group consisting of electrolessly plated metal, sputtered metal and evaporated metal.

52. The integrated circuit assembly according to claim 46, wherein the metallic film includes electrolessly plated metal.

53. The integrated circuit assembly according to claim 46, wherein the metallic film includes sputtered metal.

54. The integrated circuit assembly according to claim 46, wherein the metallic film includes evaporated metal.

55. The integrated circuit assembly according to claim 46, wherein the metallic film includes a metal selected from the group consisting of copper, nickel and gold.

56. The integrated circuit assembly according to claim 46, wherein the metallic film is positioned outside the terminal pads and does not overlap the terminal pads.

57. The integrated circuit assembly according to claim 46, wherein the plated metal is plated onto the metallic film, the terminal pads and the conductive traces.

58. The integrated circuit assembly according to claim 46, wherein the plated metal includes a top surface that extends into the via holes.

59. The integrated circuit assembly according to claim 46, wherein the plated metal has a bowl-like shape.

60. The integrated circuit assembly according to claim 46, wherein the conductive traces are positioned outside the terminal pads and do not overlap the terminal pads.

61. An integrated circuit assembly, comprising:
a dielectric substrate having first and second opposite surfaces and a plurality of via holes between the first and second surfaces;
a metallic film deposited on sidewalls of the via holes that extends along the sidewalls to the first and second surfaces;
a plurality of conductive traces on the first surface and adjacent to the via holes;
an integrated circuit chip having a plurality of input/output terminal pads, wherein the integrated circuit chip is attached to the second surface of the dielectric substrate, and the terminal pads are aligned with the via holes; and
a plated metal formed on the metallic film in the via holes, on the terminal pads and on the conductive traces, wherein the plated metal and the metallic film are different materials, and each one of the terminal pads is connected to one of the conductive traces by one continuous portion of the plated metal in one of the via holes.

62. The integrated circuit assembly according to claim 60, wherein the terminal pads are spaced from the metallic film on the sidewalls of the via holes, and the plated metal is formed on an insulative surface substantially parallel to the second surface that extends between the terminal pads and the metallic film on the sidewalls.

63. The integrated circuit assembly according to claim 60, wherein the assembly is devoid of wire bonds, TAB leads and solder joints.

64. The integrated circuit assembly according to claim 60, wherein the assembly is devoid of bumps on the terminal pads.

65. The integrated circuit assembly according to claim 60, wherein the integrated circuit chip is attached to the dielectric substrate solely by the plated metal.

66. The integrated circuit assembly according to claim 60, wherein the metallic film includes a metal selected from the group consisting of electrolessly plated metal, sputtered metal and evaporated metal.

67. The integrated circuit assembly according to claim 60, wherein the metallic film includes electrolessly plated metal.

68. The integrated circuit assembly according to claim 60, wherein the metallic film includes sputtered metal.

69. The integrated circuit assembly according to claim 60, wherein the metallic film includes evaporated metal.

70. The integrated circuit assembly according to claim 60, wherein the metallic film includes a metal selected from the group consisting of copper, nickel and gold.

71. The integrated circuit assembly according to claim 60, wherein the metallic film is positioned outside the terminal pads and does not overlap the terminal pads.

72. The integrated circuit assembly according to claim 60, wherein the metallic film adheres to the sidewalls.

73. The integrated circuit assembly according to claim 60, wherein the plated metal includes electroplated metal.

74. The integrated circuit assembly according to claim 60, wherein the plated metal includes electrolessly plated metal.

75. The integrated circuit assembly according to claim 60, wherein the plated metal is plated onto the metallic film, the terminal pads and the conductive traces.

76. The integrated circuit assembly according to claim 60, wherein the plated metal includes a top surface that extends into the via holes.

77. The integrated circuit assembly according to claim 60, wherein the plated metal has a bowl-like shape.

78. The integrated circuit assembly according to claim 60, wherein the conductive traces are positioned outside the terminal pads and do not overlap the terminal pads.

* * * * *

UNITED STATES PATENT AND TRADEMARK OFFICE
CERTIFICATE OF CORRECTION

PATENT NO. : 6,448,644 B1
DATED : September 10, 2002
INVENTOR(S) : Charles W.C. Lin It is certified that error appears in the above-identified patent and that said Letters Patent is hereby corrected as shown below:

Column 8,
Line 50, change "if" to -- of --.

Column 10,
Line 13, change "integral" to -- integrated --.

Column 12,
Line 6, change "60" to -- 61 --.
Lines 12, 16, 18, 22, 26, 28, 30, 33, 36, 39, 42, 45, 48, 51 and 53, change "60" to -- 61 --.

Signed and Sealed this

Nineteenth Day of November, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,448,644 B1
DATED : September 10, 2002
INVENTOR(S) : Charles W.C. Lin It is certified that error appears in the above-identified patent and that said Letters Patent is hereby corrected as shown below:

Column 8,
Line 50, change "if" to -- of --.

Column 10,
Line 14, change "integral" to -- integrated --.

Column 12,
Line 6, change "60" to -- 61 --.
Lines 12, 15, 18, 21, 25, 27, 29, 31, 34, 37, 39, 41, 43, 46, 49, 51 and 53, change "60" to -- 61 --.

This certificate supersedes Certificate of Correction issued November 19, 2002.

Signed and Sealed this

Eighth Day of July, 2003

JAMES E. ROGAN
*Director of the United States Patent and Trademark Office*